(12) United States Patent
Lee

(10) Patent No.: US 7,359,270 B2
(45) Date of Patent: Apr. 15, 2008

(54) SELF REFRESH PERIOD SIGNAL GENERATION DEVICE

(75) Inventor: Jae-Youl Lee, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 293 days.

(21) Appl. No.: 10/875,613

(22) Filed: Jun. 25, 2004

(65) Prior Publication Data

US 2006/0203589 A1    Sep. 14, 2006

(30) Foreign Application Priority Data

Oct. 31, 2003    (KR) .................. 10-2003-0076821

(51) Int. Cl.
*G11C 7/00* (2006.01)
*G11C 7/04* (2006.01)

(52) U.S. Cl. ...................... 365/222; 365/211

(58) Field of Classification Search ............. 365/222, 365/211
See application file for complete search history.

(56) References Cited

U.S. PATENT DOCUMENTS

| | | | |
|---|---|---|---|
| 4,639,895 A * | 1/1987 | Iwahashi et al. ............ | 365/200 |
| 6,256,253 B1 * | 7/2001 | Oberlaender et al. .. | 365/230.02 |
| 6,768,693 B2 * | 7/2004 | Feurle et al. ............... | 365/222 |
| 7,009,904 B2 * | 3/2006 | Kim ........................... | 365/211 |
| 7,038,968 B2 * | 5/2006 | Kim ........................... | 365/222 |
| 2002/0191467 A1 * | 12/2002 | Matsumoto et al. ........ | 365/222 |
| 2003/0056057 A1 * | 3/2003 | Lawrence ................... | 711/106 |
| 2005/0105367 A1 * | 5/2005 | Kim et al. .................. | 365/226 |

* cited by examiner

*Primary Examiner*—Richard T. Elms
*Assistant Examiner*—Douglas King
(74) *Attorney, Agent, or Firm*—Lowe Hauptman Ham & Berner LLP

(57) ABSTRACT

A self refresh period signal generating device includes an internal temperature sensor; an extended mode register set for storing a first temperature code which corresponds to temperature measured by an external temperature sensor; a selection means for selecting one of the first temperature code included in the extended mode register set and a second temperature code which corresponds to temperature measured by the internal temperature sensor; and a self refresh period signal generating means for generating a temperature compensated self refresh period signal in response to an output signal from the selection means.

7 Claims, 3 Drawing Sheets

SELF REFRESH PERIOD SIGNAL GENERATION DEVICE

FIELD OF INVENTION

The present invention relates to a semiconductor device; and, more particularly, to a temperature compensated self refresh period signal generating device.

DESCRIPTION OF PRIOR ART

Generally, a dynamic random access memory (DRAM) must be refreshed periodically in order to hold its data contents stored in memory cells. Therefore, the DRAM performs a self refresh operation periodically for keeping its data contents.

Since characteristic of a semiconductor device is changed as the temperature rises or falls, the DRAM senses the temperature and adjusts a self refresh period depending on the sensed temperature in order to reduce a power consumption.

FIG. 1 is a block diagram showing a first DRAM according to the prior art having a temperature compensated self refresh period signal generating device which is controlled by an extended mode register set (EMRS).

As shown, the first DRAM includes an EMRS 10, a self refresh period signal generating unit 20, an internal address signal generating unit 30, a row decoding unit 40, a column decoding unit 50 and a memory cell array 60.

The EMRS 10 stores a temperature code which corresponds to temperature variation sensed by an external temperature sensor. The self refresh period signal generating unit 20, which is controlled by the EMRS 10, generates a self refresh period signal self_REF.

The internal address generating unit 30 generates an internal row address signal in_xadd. The row decoding unit 40 decodes the internal row address signal in_xadd in order to activate a word line in response to the self refresh period signal self_REF.

The memory cell array 60 includes a plurality of memory cells, and the column decoding unit 50 serves to select a bit line of the memory cell array 60.

Table. 1 shows a plurality of control codes included in the EMRS 10 according to a specification introduced by an international electronics standardization organization, namely Joint Electron Device Engineering Council (JEDEC).

As shown, the EMRS 10 includes a temperature compensated self refresh (TCSR) code and a partial array self refresh (PASR) code. The TCSR code is used for controlling a self refresh period depending on the temperature. The PASR code is used for controlling a self refresh coverage, i.e., the PASR code limits memory array size to be refreshed. Set values of the TCSR code according to the temperature are also shown in Table. 1.

The control codes included in the EMRS 10 are decoded when bank addresses BA0 and BA1 are in a logic low level and a logic high level respectively.

An operation of the conventional DRAM is described below referring to FIG. 1 and Table. 1.

If the bank addresses BA0 and BA1 are in a logic low level and a logic high level respectively, the self refresh period signal generating unit 20, which is controlled by the TCSR code, generates the self refresh period signal self_REF.

Thereafter, the row decoding unit 40 decodes the internal row address signal in_xadd in order to selectively activate a word line included in the memory cell array 60 for performing the self refresh operation.

Meanwhile, a system which includes the first DRAM should be provided with the external temperature sensor so that the conventional DRAM can set the EMRS 10 according to the temperature.

Therefore, the first DRAM can reduce its power consumption by using the EMRS 10 which sets the TCSR code depending on the external temperature sensor. However, since the external temperature sensor additionally consumes power, total power consumption of the system cannot be reduced.

FIG. 2 is a block diagram showing a second DRAM according to the prior art having a temperature compensated self refresh period signal generating device which is controlled by an internal temperature sensor.

As shown, the second DRAM includes an internal temperature sensor 70, a self refresh signal generating unit 80, an internal address signal generating unit 30, a row decoding unit 40, a column decoding unit 50 and a memory cell array 60.

The internal temperature sensor 70 senses temperature to control the self refresh period signal generating unit 80. The self refresh period signal generating unit 80 generates a self

TABLE 1

| BA1 | BA0 | A12 | A11 | A10 | A9 | A8 | A7 | A6 | A5 | A4 | A3 | A2 | A1 | A0 |
|-----|-----|-----|-----|-----|----|----|----|----|----|----|----|----|----|----|
| 1 | 0 | 0 | 0 | 0 | 0 | 0 | 0 | DS | | TCSR | | PASR | | |

| A4 | A3 | Temperature (° C.) |
|----|----|--------------------|
| 0 | 0 | 45~70 |
| 0 | 1 | 15~45 |
| 1 | 0 | -25~15 |
| 1 | 1 | 70~85 | refresh period signal self_REF depending on the temperature sensed by the internal temperature sensor 70.

The internal address signal generating unit 30 generates an internal row address signal in_xadd, and the row decoding unit 40 decodes the internal row address signal in_xadd for selectively activating a word line.

The memory cell array 60 includes a plurality of memory cells, and the column decoding unit 50 serves to select a bit line of the memory cell array 60.

Comparing the second DRAM shown in FIG. 2 with the first DRAM shown in FIG. 1, the first DRAM controls the self refresh period depending on the EMRS 10 whose TCSR code is set by the external temperature sensor, while the second DRAM controls the self refresh period depending on the internal temperature sensor 70.

Meanwhile, a system which adopts the second DRAM can reduce a power consumption of the system. However, the second DRAM does not satisfy the JEDEC specification.

As described above, such a DRAM which includes the EMRS for controlling the self refresh period satisfies the JEDEC specification, but it can not reduce a power consumption of a system. On the other hand, such a DRAM which includes an internal temperature sensor for controlling the self refresh period can reduce a power consumption of a system, but it does not satisfy the JEDEC specification.

Therefore, a system manufacturer should select one of the first DRAM and the second DRAM depending on a control method for controlling a temperature compensated self refresh period signal. Likewise, a semiconductor memory device manufacturer should manufacture both of the first DRAM and the second DRAM for satisfying requirement of the system manufacturer.

SUMMARY OF INVENTION

It is, therefore, an object of the present invention to provide a self refresh period signal generating device capable of controlling a temperature compensated self refresh period signal by using two control methods so that a user of the self refresh period signal generating device can select one of the two control methods.

In accordance with an aspect of the present invention, there is provided a self refresh period signal generating device including an internal temperature sensor; an extended mode register set for storing a first temperature code which corresponds to temperature measured by an external temperature sensor; a selection means for selecting one of the first temperature code included in the extended mode register set and a second temperature code which corresponds to temperature measured by the internal temperature sensor; and a self refresh period signal generating means for generating a temperature compensated self refresh period signal in response to an output signal from the selection means.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device in accordance with the present invention will be described in detail referring to the accompanying drawings.

Figure 3:
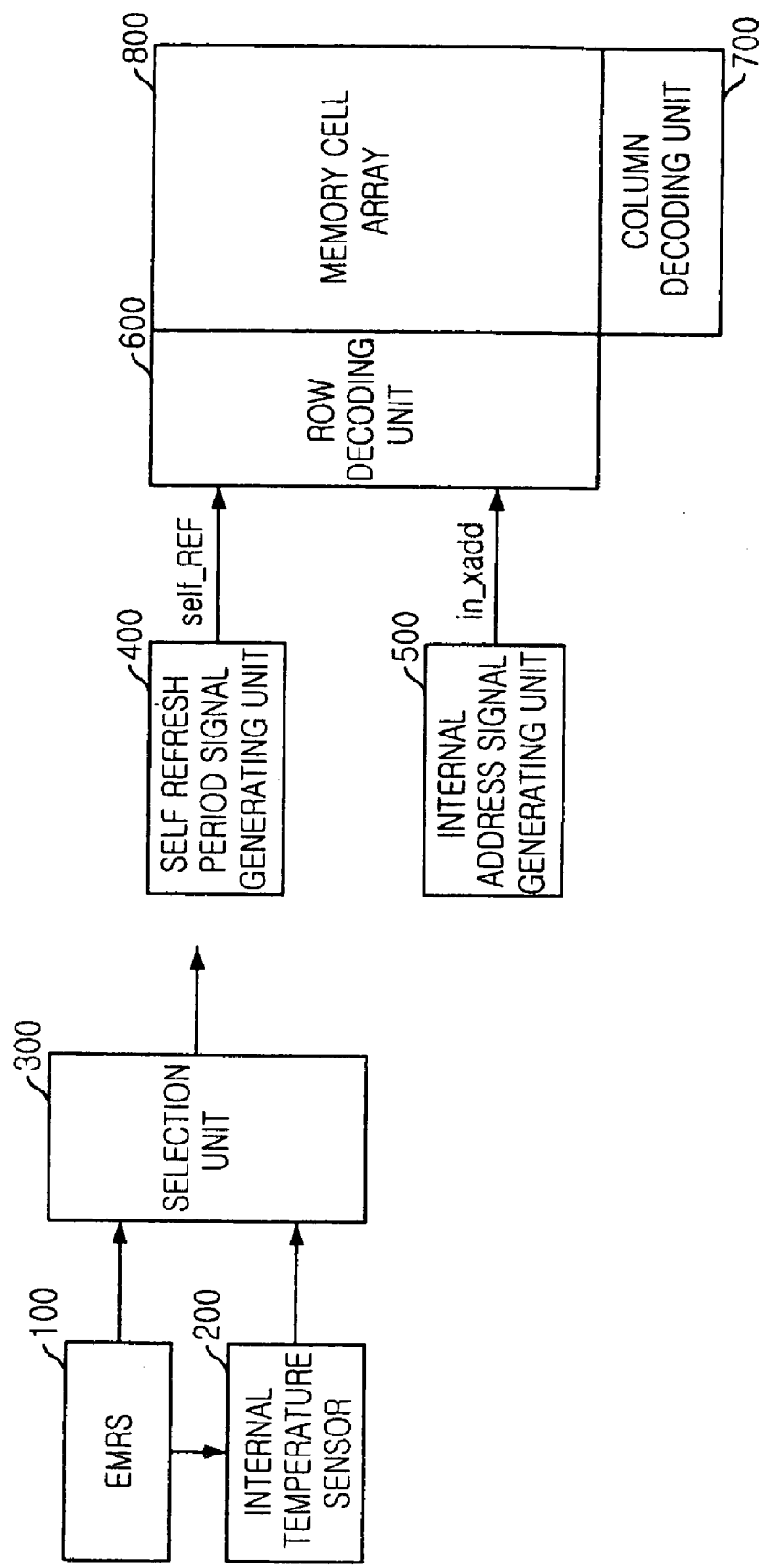
FIG. 3 is a block diagram showing a semiconductor memory device including a self refresh period signal generating device in accordance with a preferred embodiment of the present invention.

FIG. 3 is a block diagram showing a semiconductor memory device including a self refresh period signal generating device in accordance with a preferred embodiment of the present invention.

As shown, the semiconductor memory device includes an extended mode register set (EMRS) 100, an internal temperature sensor 200, a selection unit 300, a self refresh period signal generating unit 400, internal address signal generating unit 500, a row decoding unit 600, a column decoding unit 700 and a memory cell array 800.

The internal temperature sensor 200 measures temperature of the semiconductor memory device. The EMRS 100 stores a temperature compensated self refresh (TCSR) code which corresponds to temperature measured by an external temperature sensor.

The selection unit 300 determines which one of the EMRS 100 and the internal temperature sensor 200 is used for performing a self refresh operation. The self refresh period signal generating unit 400 is controlled by the selection unit 300 for generating a self refresh period signal self_REF.

The internal address signal generating unit 500 generates an internal row address signal in_xadd, and the row decoding unit 600 decodes the internal row address signal in_xadd for selectively activating a word line.

The memory cell array 800 includes a plurality of memory cells, and the column decoding unit 700 selectively activates a bit line.

Figure 1:
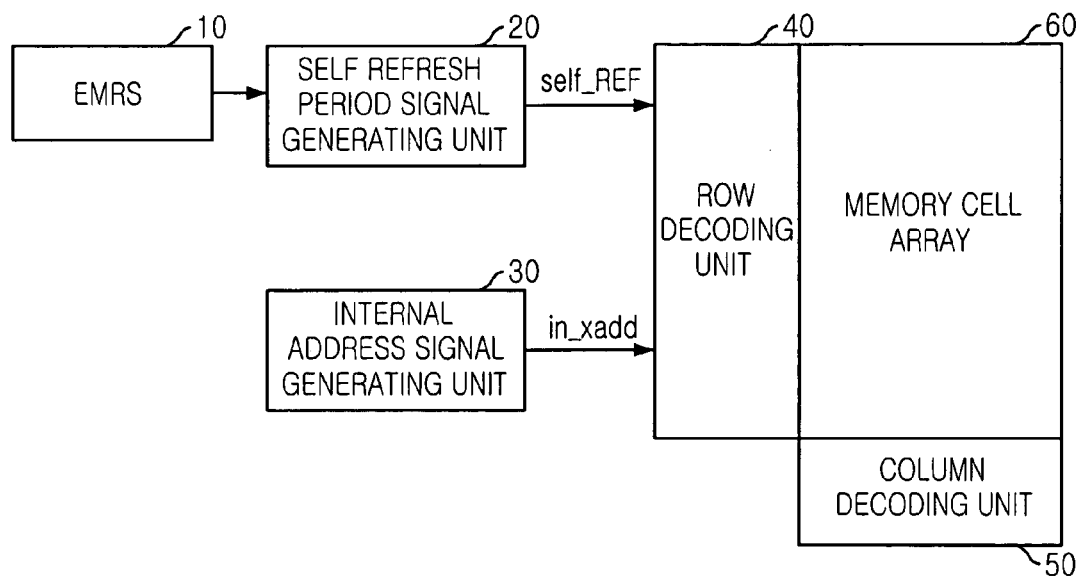
FIG. 1 is a block diagram showing a conventional DRAM having a temperature compensated self refresh period signal generating device which is controlled by an extended mode register set.
Figure 2:
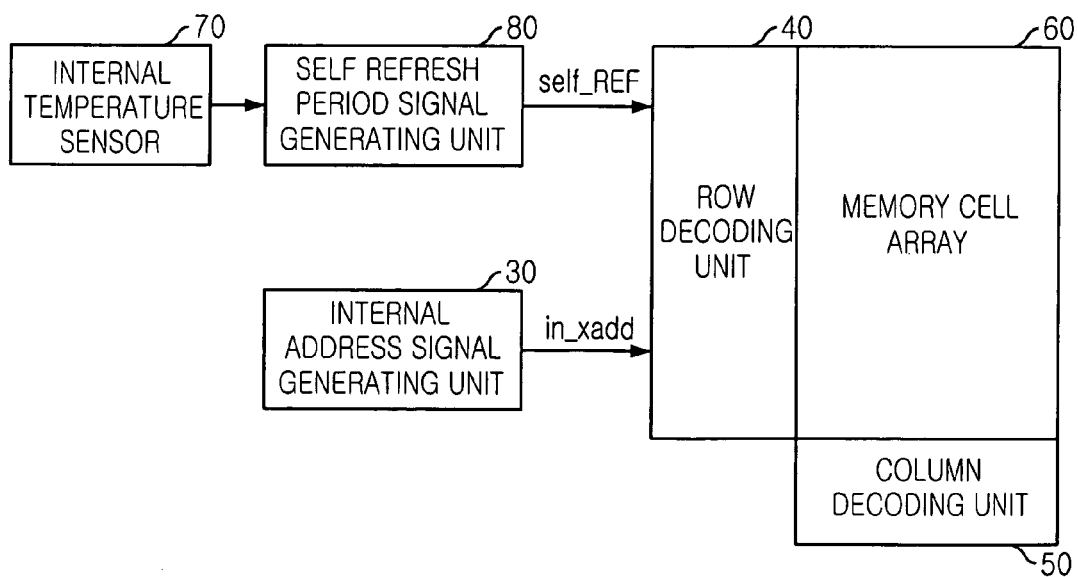
FIG. 2 is a block diagram showing another conventional DRAM having a temperature compensated self refresh period signal generating device which is controlled by an internal temperature sensor.

As shown, the semiconductor memory device further includes the selection unit 300 in comparison with semiconductor memory devices shown in FIGS. 1 and 2 because the semiconductor memory device includes both the EMRS 100 and the internal temperature sensor 200.

Table. 2 shows a plurality of control codes included in the EMRS 100 in accordance with the preferred embodiment of the present invention.

As shown, the EMRS 100 uses one of reserved addresses, e.g., an address A7, for determining which one of the TCSR codes set by an external temperature sensor and the internal temperature sensor 200 is used for performing the self refresh operation.

TABLE 2

| BA1 | BA0 | A12 | A11 | A10 | A9 | A8 | A7 | A6 | A5 | A4 | A3 | A2 | A1 | A0 |
|---|---|---|---|---|---|---|---|---|---|---|---|---|---|---|
| 1 | 0 | 0 | 0 | 0 | 0 | 0 | TS | DS | | TCSR | | PASR | | |

| A7 | TCSR setting method |
|---|---|
| 0 | External temperature sensor (external TCSR) |
| 1 | Internal temperature sensor (auto TCSR) |

That is, if the address A7 is 0, the TCSR code set by the external temperature sensor is selected by the selection unit 300 for controlling the self refresh period signal generating unit 400. On the other hand, if the address A7 is 1, values of addresses A4 and A3 of the EMRS 100 are ignored and temperature measured by the internal temperature sensor 200 is used for the self refresh period signal generating unit 400 to generate the self refresh period signal self REF. The internal temperature sensor is turned on or turned off by a selection control code TS. Thus, the internal temperature sensor 200 is connected to receive, and is activated by, a selection control code from the EMRS 100.

An operation of the semiconductor memory device is described below referring to FIG. 3 and Table. 2.

When bank addresses BA1 and BA0 are in a logic high level and a logic low level respectively, the selection unit 300 selects the TCSR code of the EMRS 100 or the internal temperature sensor 200 in response to the address A7 for controlling the self refresh period signal generating unit 400.

Thereafter, the self refresh period signal generating unit 400 generates the self refresh period signal self_REF, and the row decoding unit 600 decodes the internal row address signal in_xadd generated by the internal address signal generating unit 500 for performing the self refresh operation in response to the self refresh period signal self_REF.

Figure 4:
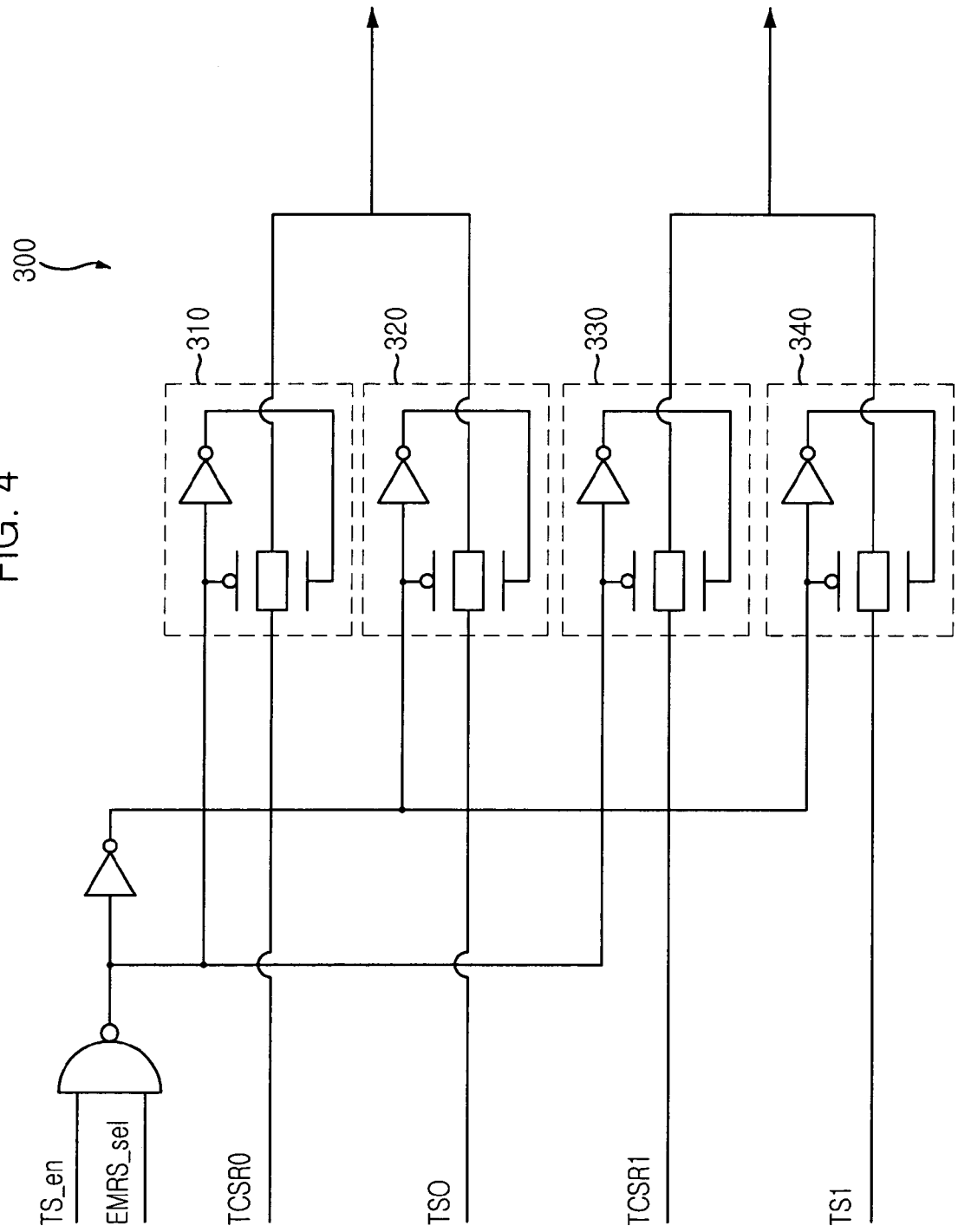
FIG. 4 is a schematic circuit diagram showing a selection unit shown in FIG. 3.

FIG. 4 is a schematic circuit diagram showing the selection unit 300.

As shown, the selection unit 300 includes a NAND gate ND1, an inverter I1, a first to a fourth transferring gates 310 to 340.

The NAND gate ND1 receives an extended mode register set selection signal EMRS_sel and a temperature sensor enable signal TS_en for performing a logic NAND operation to the extended mode register set selection signal EMRS_sel and the temperature sensor enable signal TS_en.

The inverter I1 inverts an output signal from the NAND gate ND1 and outputs the inverted signal to the second and the fourth transferring gates 320 and 340.

If the address A7 is 0, the first and the third transferring gates 310 and 330 transfer a first-bit TCSR code signal TCSR0 and a second-bit TCSR code signal TCSR1 of the TCSR code to the self refresh period signal generating unit 400.

On the other hand, if the address A7 is 1, the second and the fourth transferring gates 320 and 340 transfer a first-bit temperature sensor signal TS0 and a second-bit temperature sensor signal TS1 of the internal temperature sensor 200 to the self refresh period signal generating unit 400.

Meanwhile, the extended mode register set selection signal EMRS_sel is one of the bank address signals BA1 and BA0 which is in a logic high level. The temperature sensor enable signal TS_en is an inverted signal of the address A7.

Table. 3 shows a plurality of control codes included in the EMRS 100 in accordance with another embodiment of the present invention.

TABLE 3

| BA1 | BA0 | A12 | A11 | A10 | A9 | A8 | A7 | A6 | A5 | A4 | A3 | A2 | A1 | A0 |
|---|---|---|---|---|---|---|---|---|---|---|---|---|---|---|
| 1 | 0 | 0 | 0 | 0 | 0 | 0 | 0 | DS | | TCSR | | PASR | | |

| A4 | A3 | Temperature (° C.) |
|---|---|---|
| 0 | 0 | Internal temperature sensor (auto TCSR) |
| 0 | 1 | 15~45 (External temperature sensor) |
| 1 | 0 | -25~15 (External temperature sensor) |
| 1 | 1 | 70~85 (External temperature sensor) |

As shown, the selection unit 300 uses the internal temperature sensor 200 for controlling the self refresh period signal generating unit 400 when both of addresses A4 and A3 are in a logic low level.

On the other hand, when at least one of the addresses A4 and A3 is in a logic high level, the selection unit 300 uses the TCSR code included in the EMRS 100 for controlling the self refresh period signal generating unit 400.

Herein, a temperature range from about 45° C. to about 70° C. is set to a default value.

As described above, the semiconductor memory device includes both the EMRS 100 and the internal temperature sensor 200 and selects one of them to control the self refresh period signal generating unit 400.

Therefore, the semiconductor memory device in accordance with the present invention can provide two control methods for controlling a self refresh period. One of the two control methods satisfies a Joint Electron Device Engineering Council (JEDEC) specification, and the other does not satisfy the JEDEC specification but a power consumption of a system where the semiconductor memory device is included can be reduced by using the other method. As a result, a user of the semiconductor memory device can select one of the two control methods depending on a system which the user uses or manufactures; and, a semiconductor memory device manufacturer can satisfy requirement of the user without manufacturing two different kinds of semiconductor memory devices having different control methods of the self refresh period.

In addition, the semiconductor memory device above described can be modified so that output signals from the EMRS 100 and the internal temperature are directly inputted to the self refresh period signal generating unit 400 and the self refresh period signal generating unit 400 selects one of them by modifying the self refresh period signal generating unit 400.

The present application contains subject matter related to Korean patent application No. 2003-76821, filed in the Korean Patent Office on Oct. 31, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A self refresh period signal generating device comprising:

an extended mode register set for storing a first temperature code included in a set of control codes for the extended mode register set, wherein the first temperature code corresponds to temperature measured by an external temperature sensor and the set of control codes for the extended mode register set further includes a selection control code for determining which of the internal temperature sensor and the external temperature sensor is used;

an internal temperature sensor for measuring temperature wherein the internal temperature sensor is turned on or turned off in response to the selection control code;

a selection means for selecting one of the first temperature code included in the set of control codes for the extended mode register set and a second temperature code which corresponds to temperature measured by the internal temperature sensor in response to the selection control code; and a self refresh period signal generating means for generating a temperature compensated self refresh period signal in response to an output signal from the selection means.

2. The self refresh period signal generating device as recited in claim 1, wherein the temperature code included in the set of control codes for the extended mode register set is a 2-bit code which corresponds to two bits of an address signal.

3. The self refresh period signal generating device as recited in claim 1, wherein the selection control code included in the set of control codes for the extended mode register set is a 1-bit code which corresponds to one bit of an address signal.

4. The self refresh period signal generating device as recited in claim 3, wherein the selection means includes:

a NAND gate for receiving the selection control code and a bank address; and a plurality of transferring gates for outputting one of the first temperature code and the second temperature code depending on an output signal from the NAND gate.

5. The self refresh period signal generating device as recited in claim 1, wherein the first temperature code included in the set of control codes for the extended mode register set is a 2-bit code which corresponds to two bits of an address signal and the selection control code is one of four combinations of the 2-bit code.

6. The self refresh period signal generating device as recited in claim 5, wherein the selection means includes:

a NAND gate for receiving the selection control code and a bank address; and a plurality of transferring gates for outputting one of the first temperature code and the second temperature code depending on an output signal from the NAND gate.

7. The self refresh period signal generating device as recited in claim 1, wherein the selection means includes:

a NAND gate for receiving the selection control code and a bank address; and a plurality of transferring gates for outputting one of the first temperature code and the second temperature code depending on an output signal from the NAND gate.

* * * * *